United States Patent
Kurata et al.

(10) Patent No.: US 6,799,711 B2
(45) Date of Patent: Oct. 5, 2004

(54) MINUTE COPPER BALLS AND A METHOD FOR THEIR MANUFACTURE

(75) Inventors: Ryoichi Kurata, Tochigi (JP); Hoshiro Takahashi, Mouka (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 5 days.

(21) Appl. No.: 10/327,656

(22) Filed: Dec. 24, 2002

(65) Prior Publication Data

US 2003/0141342 A1 Jul. 31, 2003

(30) Foreign Application Priority Data

Jan. 7, 2002 (JP) .................................. 2002-000662
Nov. 8, 2002 (JP) .................................. 2002-324834

(51) Int. Cl.[7] .................. B23K 31/02; B23K 35/14; C22C 9/04
(52) U.S. Cl. .................. 228/56.3; 228/246; 228/254; 420/477
(58) Field of Search .................. 228/245, 248, 228/254, 180.22, 56.3; 420/477–484; 438/613, 614; 257/737, 738

(56) References Cited

U.S. PATENT DOCUMENTS

| 4,925,740 | A | * | 5/1990 | Norris et al. ................ 428/547 |
| 5,808,874 | A | * | 9/1998 | Smith .......................... 361/769 |
| 6,066,551 | A | * | 5/2000 | Satou et al. ................ 438/613 |
| 6,358,630 | B1 | * | 3/2002 | Tsukada et al. ............. 428/646 |
| 2002/0086229 | A1 | * | 7/2002 | Yuasa et al. ............. 430/108.4 |
| 2002/0102432 | A1 | * | 8/2002 | Ochiai et al. ................ 428/671 |
| 2002/0114726 | A1 | * | 8/2002 | Soga et al. .................. 420/557 |
| 2002/0132462 | A1 | * | 9/2002 | Tatsumi et al. ............. 438/613 |
| 2002/0171157 | A1 | * | 11/2002 | Soga et al. .................. 257/783 |
| 2003/0141342 | A1 | * | 7/2003 | Kurata et al. ............. 228/56.3 |
| 2003/0178313 | A1 | * | 9/2003 | Tanaka et al. ................ 205/74 |
| 2003/0224197 | A1 | * | 12/2003 | Soga et al. .................. 428/570 |
| 2004/0031690 | A1 | * | 2/2004 | Tanaka et al. ................ 205/74 |

FOREIGN PATENT DOCUMENTS

| DE | 3104960 | | 8/1982 |
| EP | 0457920 | | 11/1991 |
| EP | 1009202 | | 6/2000 |
| EP | 1028180 | | 8/2000 |
| JP | 2002079100 A | * | 3/2002 |
| JP | 02003268403 A | * | 9/2003 |
| WO | 9731129 | | 8/1997 |

OTHER PUBLICATIONS

J.R. Davis, Ed. "Copper and Copper Alloys", p. 4, published by ASM International, Aug. 1, 2001.

* cited by examiner

Primary Examiner—Kiley Stoner
(74) Attorney, Agent, or Firm—Michael Tobias

(57) ABSTRACT

Minute copper balls having a high sphericity which are suitable for use as the cores of copper core solder balls are manufactured by heating small pieces comprising an alloy of 0.5–40 wt % of Zn and a remainder of Cu to at least the melting point of Cu without the pieces contacting each other to give them a spherical shape and cooling the resulting spheres to form solid balls. The minute copper balls which are obtained comprises 0.01–0.5 wt % of Zn and a remainder of Cu and have a spherical shape with a diameter in the range of 50–1000 μm.

11 Claims, 1 Drawing Sheet

MINUTE COPPER BALLS AND A METHOD FOR THEIR MANUFACTURE

BACKGROUND OF THE INVENTION

1. Field of the Invention

This invention relates to minute copper balls suitable for use as copper cores of copper core solder balls which are used for forming bumps on semiconductor electronic parts (referred to below simply as electronic parts) such as BGA (ball grid array) devices, CSP's (chip scale packages), and MCM's (multichip modules) and to a method for their manufacture.

2. Description of the Related Art

Minute solder balls having a diameter in the range of 50–1000 µm are used for forming bumps on electronic parts. After solder balls are distributed on the electrodes of an electronic part, the solder balls are melted to form bumps. When the electronic part is mounted on a printed circuit board, the electronic part is disposed on the printed circuit board so that the solder bumps on the electronic part coincide with the portions to be soldered on the printed circuit board, and then the solder bumps are melted to solder the electronic part to the printed circuit board.

A typical solder ball is comprised solely of solder. When solder bumps made from such solder balls are formed on an electronic part and melted in order to solder the electronic part to a printed circuit board, the molten solder bumps are flattened by the weight of the electronic part which lies thereon. As a result, adjoining solder bumps may be fused to each other, or the molten solder may spread to the exterior of the electronic parts, thereby causing short circuits and other operational problems.

In light of these problems, "copper core solder balls" for forming solder bumps on electronic parts have been developed. A copper core solder ball has a core of a copper ball, and the core is coated with solder by plating. If copper core solder balls are used to form solder bumps on an electronic part, when the electronic part is soldered to a printed circuit board, only the solder coating of the copper core solder balls melts. Thus, although the weight of the electronic part is applied to the bumps during soldering, the copper balls forming the cores can support the weight, and the solder balls are not flattened. Accordingly, copper core solder balls enable highly reliable connection of electronic parts to printed circuit boards.

Electronic parts such as BGA devices, CSP's, and MCM's have a large number of electrodes, and the distance between electrodes is extremely small. Copper balls for copper core solder balls used with such electronic parts must have a prescribed size with a high dimensional accuracy, and they also need to have good sphericity. As used herein, sphericity of a ball is defined by the following equation:

$$\text{Sphericity } (\%) = [(D_{max} - D_{min}) \div (D_{max} + D_{min})/2] \times 100 \quad (1)$$

where $D_{max}$ is the largest diameter of a solder ball and $D_{min}$ is the smallest diameter thereof. It is desirable for copper balls for use in copper core solder balls to have an average sphericity (for 100 samples) of 2% or lower.

Copper balls used as cores for copper core solder balls have conventionally been manufactured by a method which comprises cutting a thin copper wire to make copper chips having fixed lengths and heating the copper chips to a temperature above the melting point of copper to form them into spheres. However, with such a conventional method, no matter how the manufacturing conditions are varied, it is difficult to obtain copper balls having an average sphericity of at most 2%.

Since copper balls manufactured by a conventional method have poor sphericity, copper core solder balls produced from these copper balls by plating with solder likewise have poor sphericity. When copper core solder balls having poor sphericity are being distributed on an electronic part, they cannot be held reliably by a suction device used to grasp solder balls in a solder ball distributing apparatus, and the solder balls are sometimes not distributed on all the electrodes of the electronic part, i.e., some electrodes may not have a solder ball thereon.

Another problem with conventional copper core solder balls is that the bonding strength of solder bumps formed therefrom on an electronic part is lower than the bonding strength of solder bumps formed from solder balls comprised solely of solder.

SUMMARY OF THE INVENTION

This invention provides minute copper balls which have good sphericity and which have a sufficient bonding strength when plated with solder to form copper core solder balls and then used to form solder bumps on electronic parts.

This invention also provides a method for the manufacture of such copper balls.

The present inventors found that instead of forming minute copper balls from pure copper, it is effective to form copper balls by melting small pieces comprising a Cu—Zn alloy to form the pieces into spheres. Since Zn has a much higher vapor pressure than Cu, most of Zn is removed by vaporization at the high temperature at which copper melts, and only a slight amount of Zn remains in the balls formed by melting. Although the resulting minute balls contain a slight amount of Zn, they can be effectively used as minute copper balls in the manufacture of copper core solder balls. Compared to Cu, a Cu—Zn alloy has a high surface tension when melted, and it forms minute copper balls having a high sphericity when formed into spheres by melting. In addition, it has been found that when bumps are formed on an electronic part using copper core solder balls having cores of copper balls which contain a slight amount of Zn, a decrease in bonding strength encountered with conventional copper core balls can be significantly suppressed.

According to one aspect of the present invention, minute copper balls have a composition consisting essentially of 0.01–0.5 wt % of Zn and a remainder of Cu and having a spherical shape with a diameter in the range of 50–1000 µm.

According to another aspect of the present invention, a method of manufacturing minute copper balls comprises heating small pieces comprising a Cu—Zn alloy, the alloy consisting essentially of 0.5–40 wt % of Zn and a remainder of Cu, to a temperature which is at least the melting point of copper without contacting the pieces with each other to form the pieces into spheres having a Zn content of 0.01–0.5 wt %, and then cooling the spheres to form solid balls.

DESCRIPTION OF PREFERRED EMBODIMENTS

Figure 1:
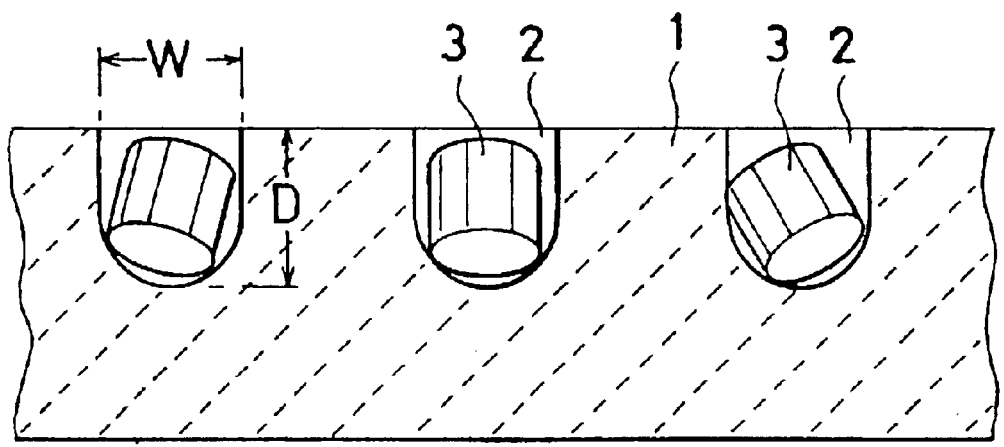
FIG. 1 is a schematic view of a stage in a method of manufacturing minute copper balls according to the present invention showing small pieces of a Cu—Zn alloy prior to heating.

Minute copper balls according to the present invention have a diameter within the range of 50–1000 μm. Recent electronic parts such as CSP's and MCM's have electrodes with a pitch which may be 120 μm or smaller. In order to make minute copper balls according to the present invention usable with such electronic parts, the lower limit on the diameter of the copper balls is made 50 μm. Copper balls having a diameter exceeding 1000 μm are not used with electronic parts. In addition, if the diameter exceeds 1000 μm, at the time of manufacture of the copper balls by melting, the balls flatten under their own weight during heating, and their sphericity becomes poor.

In order for the minute copper balls to be used as cores of solder balls, the minute copper balls have a uniform diameter within the above-described range, i.e., they have substantially the same diameter as each other. A uniform diameter for solder balls having the same nominal diameter encompasses variations of the diameter from an average value by up to ±3%, but it is of course preferable for the variation to be as small as possible.

Minute copper balls according to the present invention preferably have an average sphericity of 2% or smaller. Sphericity is a value calculated by the foregoing equation (1). The smaller this value, the better the sphericity. The average sphericity is the average value of the sphericity of 100 randomly selected balls. The diameter of a copper ball is calculated as $(D_{max}+D_{min})/2$.

As stated above, bumps formed on an electronic part using copper core solder balls having cores of pure copper balls have a poor bonding strength. This is because when the solder which constitutes the coating layer of the copper core solder balls is melted in order to form bumps on the electronic part, the Sn in the solder and the Cu in the copper balls readily combine to form a brittle intermetallic compound, thereby embrittling the solder coating layer.

In contrast, with copper core solder balls having cores of copper balls according to the present invention which have a composition consisting essentially of 0.01–0.5 wt % of Zn and a remainder of Cu, a decrease in bonding strength of bumps is suppressed by the slight amount of Zn present in the core copper balls. Zn combines more readily with Sn than does Cu. Therefore, if a slight amount of Zn is present in the core copper balls, the Zn preferentially combines with the Sn in the solder coating layer, and the formation of a brittle intermetallic compound of Sn and Cu, which is a cause of a decrease in bonding strength, is suppressed during melting of the solder coating layer to form bumps. This effect of Zn is not appreciable if the content of Zn in the core copper balls is less than 0.01 wt %. On the other hand, if the Zn content exceeds 0.5 wt %, it has an adverse effect on solderability. The Zn content in the minute copper balls is preferably 0.05–0.3 wt % and more preferably 0.1–0.25 wt %.

The presence of Zn in minute copper balls has the additional effect that it provides an increased surface tension when the balls are formed by melting, thereby producing spheres having high sphericity.

In a manufacturing method for minute copper balls according to the present invention, a Cu—Zn alloy having a Zn content of 0.5–40 wt % is used as a raw material. If the Zn content in the raw material alloy is less than 0.5 wt %, the effect of Zn on increasing surface tension is not appreciable. On the other hand, if the Zn content in the raw material alloy is higher than 40 wt %, no additional effect on surface tension is obtained, and the decrease in volume due to vaporization of Zn during melting becomes large, thereby making it difficult to obtain spheres having a predetermined diameter. The Zn content of the raw material Cu—Zn alloy is preferably 2–40 wt % and more preferably 5–40 wt %.

Examples of materials which can be used as the Cu—Zn alloy raw material include brasses such as so-called six-four brass (Cu-40Zn) and seven-three brass (Cu-30Zn). These materials are readily available and inexpensive.

In the method according to the present invention, small pieces which comprise the raw material Cu—Zn alloy are used to form spheres by melting. As long as the small pieces can form spheres with a uniform a diameter of 50–1000 μm by melting, there are no restrictions on the shape and manufacturing method of the small pieces. For example, the small pieces may be chips formed from a thin wire of a Cu—Zn alloy by cutting to a fixed length, small discs or other shapes formed from a Cu—Zn alloy plate by cutting (punching) with a die, or clumps formed from a paste comprising a Cu—Zn alloy powder and a binder to give a certain shape by screen printing, dispensing, pelletizing (extrusion and cutting), or other suitable method. The size of the small pieces is selected in view of the content of the volatile components (Zn and, if present, a binder) present therein such that after these volatile components have been removed nearly entirely during heating, minute copper balls having a desired diameter are obtained.

When the small pieces are clumps formed from a paste, the paste is preferably prepared by mixing a Cu—Zn alloy powder with a binder which entirely vaporizes during the heating step and which does not react with Cu or Zn. Accordingly, a thermosetting resin, which may leave a carbon residue, is not desirable for use as a binder. As is the case with solder paste, it is preferred to use a flux as a binder because a flux can provide a cleaning effect during heating. A particularly preferred flux for use as the binder is a flux used in brazing. As described below, such a flux also functions as a reducing agent.

The small pieces comprising a raw material Cu—Zn alloy are heated to a temperature which is equal to or above the melting point of copper without contacting each other to form them into spheres, which are then cooled to solidify them while keeping their spherical shape.

There are no particular restrictions on the heating method as long as it can heat the small pieces to at least the melting point of copper (1083° C.) while the pieces are kept from contacting each other. Preferably the heating atmosphere can be adjusted. For example, the small pieces of a raw material Cu—Zn alloy can be placed atop a heat resistant plate made of a ceramic or similar material in such a manner they are separated from each other, and they can be heated in a furnace together with the ceramic plate.

Figure 2:
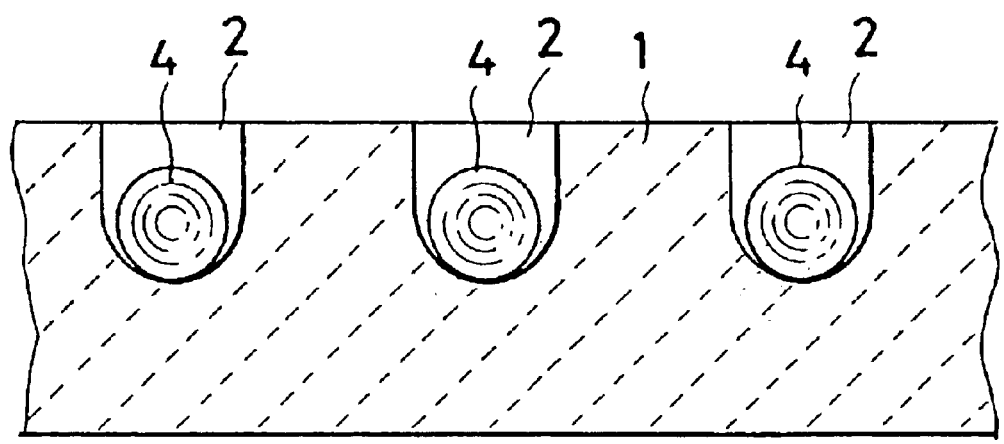
FIG. 2 is a schematic view of a later stage in the method shown in FIG. 1 after heating the small pieces of a Cu—Zn alloy to form them into spheres.

As shown in FIG. 1, a heat resistant plate (a ceramic plate 1 in the figure) may have holes 2 which have a circular horizontal cross section and a semispherical bottom surface, and one small piece 3 of a raw material Cu—Zn alloy is placed in each hole 2 and heated. In this manner, minute copper balls 4 having an even higher sphericity are formed in the holes 2 as shown in FIG. 2.

The small pieces comprising the raw material Cu—Zn alloy is preferably heated in a reducing atmosphere whereby copper balls having a smooth surface and high sphericity can be obtained. Examples of a reducing atmosphere are a hydrogen-containing gas, a gas formed by thermal decomposition of ammonia, carbon monoxide gas, and the like. Small pieces comprising the raw material Cu—Zn alloy may also be heated in the presence of a reducing agent which is active at the heating temperature. A suitable reducing agent is one which can remove the oxide film on the alloy by reduction at the melting point of Cu and which can prevent reoxidation. For example, a flux used in brazing is suitable as a reducing agent. When such a reducing agent is used, the atmosphere in the heating furnace need not be a reducing atmosphere and may be an inert gas atmosphere or air, for example.

As stated earlier, when small pieces comprising a raw material Cu—Zn alloy are made from a paste using a flux as a binder, since the flux, which functions as a reducing agent, constitutes a part of the small pieces, heating takes place in the presence of a reducing agent. Therefore, in this case, heating may be performed in air or in an inert gas atmosphere. When using a reducing agent which is not contained in the small pieces themselves, the reducing agent is preferably disposed so as to contact the small pieces of the Cu—Zn alloy during heating. For example, in the example shown in FIG. 1, a small amount of a reducing agent may be added to the inside of each hole 2. The amount of reducing agent which is used is preferably such as to prevent oxidation of Cu and Zn during heating.

The heating temperature is at least 1083° C., which is the melting point of Cu. The melting point of a Cu—Zn alloy is lower than the melting point of Cu. For example, the melting point is approximately 900° C. for a Cu-40Zn alloy and approximately 950° C. for a Cu-30Zn alloy. However, due to a low boiling point of Zn which is 907° C., while a Cu—Zn alloy is heated and melted, the Zn content of the alloy decreases by vaporization of Zn and the melting point of the alloy increases to approach the melting point of Cu. Therefore, in order to maintain a molten state of the alloy after most of Zn vaporizes, heating is performed at a temperature which is equal to or higher than the melting point of Cu during at least the final stage of heating. Heating is continued until the Zn content becomes 0.01–0.5 wt % by vaporization of Zn. Since the size of the small pieces are extremely small, vaporization of Zn occurs rapidly, and heating for a long time is not normally necessary.

After heating, the resulting molten spheres are cooled to solidify them while maintaining their spherical shape, and minute copper balls according to the present invention are obtained. In order to prevent oxidation during cooling, cooling is preferably carried out in a non-oxidizing atmosphere (such as a reducing atmosphere or an inert gas atmosphere).

Copper core solder balls can be manufactured by coating minute copper balls according to the present invention with solder. Coating with solder can be carried out by any suitable method, such as by electroplating in a manner well known to those skilled in the art. Examples of solders which can be used for coating are alloys containing Sn and/or Pb. More specific examples of such solders are Sn—Pb based solders represented by a eutectic solder (63Sn—Pb), and Sn-based lead-free solders such as Sn—Ag based solders and Sn—Ag—Cu based solders.

When minute copper balls according to the present invention are used to manufacture copper core solder balls and the resulting copper core solder balls are used to form bumps on an electronic part, the Zn in the balls serves to suppress the formation of brittle intermetallic compounds of Cu and Sn, thereby making it possible to form reliable bumps with which a decrease in the bonding strength between the bumps and the electronic part due to the formation of the intermetallic compounds is avoided. In addition, the raw material Cu—Zn alloy used in a method according to the present invention has a larger surface tension than Cu when melted, resulting in the formation of minute copper balls having good sphericity. In addition, with this method, although Zn is removed almost entirely by vaporization during melting of the raw material Cu—Zn alloy, the resulting minute copper balls still contain a slight amount of Zn, which is enough to suppress the formation of intermetallic compounds of Cu and Sn. As a result, strong joints are obtained when the minute copper balls are used in copper core solder balls.

EXAMPLES

Example 1

As shown in FIG. 1, a ceramic plate 1 having a large number of holes 2 formed therein was prepared. Each hole 2 had a circular horizontal cross section and a semispherical bottom. The diameter W in a horizontal plane of each hole was 0.8 mm, and its depth D was 0.88 mm.

A chip 3 obtained by cutting a thin wire of a Cu-40Zn alloy having a diameter of 0.55 mm to a length of 0.789 mm was placed into each hole 2 in the ceramic plate 1. Then, the ceramic plate 1 was placed into a heating furnace, and the furnace was filled with a gas formed by thermal decomposition of ammonia and heated to 1150° C., which is higher than the melting point of copper. As the furnace temperature reached the melting point of the Cu-40Zn alloy, the chips melted and formed spheres. After heating, the furnace was cooled, and minute copper balls 4 were formed in the holes 2 in the ceramic plate 1 as shown in FIG. 2.

The resulting copper balls had an average diameter of 0.604 mm (604 $\mu$m) and an average sphericity of 1.14% for 100 balls. The amount of variation in the diameter for 100 balls was at most ±2.3%. Upon chemical analysis, the copper balls were found to have a Zn content of 0.26 wt % with a remainder of Cu.

Example 2

A large number of small disks with a diameter of 0.8 mm were formed from a thin plate (0.03 mm thick) of a Cu-30Zn alloy by die cutting. The disks were disposed on a flat ceramic plate without holes so as to be spaced from each other, and they were heated and then cooled under the same conditions as for Example 1.

The resulting minute copper balls had an average diameter of 0.583 mm (583 $\mu$m) and a sphericity of 1.58% for 100 balls. The variation in the diameter for 100 balls was at most ±2.5%. Upon chemical analysis, the copper balls were found to have a composition of 0.18 wt % Zn and a remainder of Cu.

Example 3

A paste made by mixing a Cu-10Zn alloy powder (particle size: 45–36 $\mu$m) and a binder (a flux for brazing which comprised borax, a fluoride compound, and a solvent) was applied by screen printing to a ceramic plate in small portions of a fixed quantity separated from each other to form a large number of clumps of the paste on the ceramic plate. The ceramic plate and the clumps of paste adhered to the plate were heated to 1150° C. in an inert gas atmosphere furnace filled with nitrogen gas and then cooled in the furnace to obtain minute copper balls.

The resulting copper balls had an average diameter of 0.52 mm (520 $\mu$m) and a sphericity of 1.81% for 100 balls. The variation in the diameter for 100 balls was at most±2.8%. Upon chemical analysis, the copper balls were found to have a composition of 0.15 wt % of Zn and a remainder of Cu.

Comparative Example 1

Chips obtained by cutting a thin wire (0.55 mm in diameter) of pure copper to a length of 0.476 mm were heated and cooled in the same manner as in Example 1 to form minute copper balls.

The resulting copper balls had an average particle diameter of 0.602 mm (602 μm) and a sphericity of 2.38% for 100 balls. The variation in the diameter for 100 balls was at most±2.6%. Compared to the copper balls of Examples 1–3, the average sphericity of these copper balls was poor and exceeded the desirable upper limit of 2%.

A 63Sn—Pb solder was electroplated to a thickness of 30 μm on the surface of the copper balls obtained in Examples 1–3 and Comparative Example 1 to form copper core solder balls. These copper core solder balls were used to form bumps on BGA devices, and the average tensile strength of the bumps was measured to evaluate the bonding strength. The results are shown below together with the values for solder balls consisting solely of a 63Sn—Pb solder.

| Test Material | Average Tensile Strength (N) |
| --- | --- |
| Example 1 | 19.7 |
| Example 2 | 19.8 |
| Example 3 | 19.3 |
| Comparative Example 1 | 17.5 |
| 63Sn-Pb | 20.1 |

As can be seen from the above table, copper core solder balls having cores of the copper balls of Examples 1–3 had an average tensile strength which was comparable to that of solder balls consisting solely of solder, whereas the copper core solder balls of Comparative Example 1 in which the core copper balls were pure copper balls had a low value of 17.5 N for average tensile strength.

What is claimed is:

1. Minute copper balls having a composition consisting essentially of 0.01–0.5 wt % of Zn and a remainder of Cu and having a spherical shape with a diameter in the range of 50–1000 μm.

2. Minute copper balls as set forth in claim 1, wherein the copper balls have an average sphericity of at most 2%.

3. A method of manufacturing minute copper balls comprising heating small pieces comprising a Cu—Zn alloy consisting essentially of 0.5–40 wt % of Zn and a remainder of Cu to a temperature which is at least the melting point of copper without contacting the pieces with each other to form the pieces into spheres with a Zn content of 0.01–0.5 wt %, and then cooling the spheres to form solid balls.

4. A method as set forth in claim 3 wherein the small pieces consist essentially of the Cu—Zn alloy.

5. A method as set forth in claim 3 wherein the small pieces consist essentially of the Cu—Zn alloy and one or more volatile additives.

6. A method as set forth in claim 4 wherein the small pieces are formed by cutting a thin wire of the Cu—Zn alloy.

7. A method as set forth in claim 4 wherein the small pieces are formed by die cutting of a plate of the Cu—Zn alloy.

8. A method as set forth in claim 5 wherein the small pieces are formed from a paste comprising a powder of the Cu—Zn alloy and a binder.

9. A method as set forth in claim 3 wherein heating of the small pieces is carried out in a reducing atmosphere.

10. A method as set forth in claim 3 wherein heating of the small pieces is carried out in the presence of a reducing agent.

11. A method of manufacturing copper core solder balls comprising coating the minute copper balls as set forth in claim 1 with solder.

* * * * *